(12) United States Patent
Liang et al.

(10) Patent No.: US 9,715,272 B2
(45) Date of Patent: Jul. 25, 2017

(54) PORTABLE ELECTRONIC DEVICE AND CORE SWAPPING METHOD THEREOF

(71) Applicant: HTC Corporation, Taoyuan, Taoyuan County (TW)

(72) Inventors: Yu-Hsin Liang, Taoyuan (TW); Shih-Hung Chu, Taoyuan (TW)

(73) Assignee: HTC CORPORATION, Taoyuan (TW)

( * ) Notice: Subject to any disclaimer, the term of this patent is extended or adjusted under 35 U.S.C. 154(b) by 330 days.

(21) Appl. No.: 14/261,037

(22) Filed: Apr. 24, 2014

(65) Prior Publication Data

US 2015/0309560 A1    Oct. 29, 2015

(51) Int. Cl.
G06F 1/32         (2006.01)
G06F 9/54         (2006.01)
G01R 15/18        (2006.01)

(52) U.S. Cl.
CPC ............ *G06F 1/3293* (2013.01); *G06F 1/324* (2013.01); *G06F 1/3287* (2013.01);
(Continued)

(58) Field of Classification Search
CPC .. G01R 19/0092; G01R 15/18; G01R 15/181; G01R 15/183; G01R 15/186
(Continued)

(56) References Cited

U.S. PATENT DOCUMENTS 5,752,046 A * 5/1998 Oprescu ................. G06F 1/26
700/286

6,035,408 A * 3/2000 Huang .................. G06F 1/3203
713/300

(Continued)

FOREIGN PATENT DOCUMENTS

| CN | 1801132 A   | 7/2006 |
|----|-------------|--------|
| CN | 1914626 A   | 2/2007 |
| CN | 101231551 A | 7/2008 |

OTHER PUBLICATIONS

Bergamaschi, Reinaldo, et al. "Exploring power management in multi-core systems." Design Automation Conference, 2008. ASPDAC 2008. Asia and South Pacific. IEEE, 2008.*

(Continued)

*Primary Examiner* — Jermele M Hollington
*Assistant Examiner* — Christopher McAndrew
(74) *Attorney, Agent, or Firm* — Birch, Stewart, Kolasch & Birch, LLP

(57) ABSTRACT

A portable electronic device is provided. A power management unit provides a first voltage and a second voltage. A multi-core cluster includes a first processing core configured to be powered by the first voltage and operate at a first operating frequency and a second processing core configured to be powered by the first voltage or the second voltage and operate at a second operating frequency. A third processing core is configured to be powered by the second voltage and operate at a third operating frequency. A first switch is configured to selectively provide the second voltage to the third processing core or stop providing the second voltage to the third processing core according to a first control signal. A second switch is configured to selectively provide the first voltage or the second voltage to the second processing core according to a second control signal.

21 Claims, 6 Drawing Sheets

(52) U.S. Cl.
CPC ............ G06F 1/3296 (2013.01); G06F 9/542 (2013.01); *G01R 15/18* (2013.01); *G01R 15/181* (2013.01); *G01R 15/183* (2013.01); *G01R 15/186* (2013.01); *Y02B 60/121* (2013.01); *Y02B 60/1217* (2013.01); *Y02B 60/1282* (2013.01); *Y02B 60/1285* (2013.01)

(58) Field of Classification Search
USPC .......................................................... 324/127
See application file for complete search history.

(56) References Cited

U.S. PATENT DOCUMENTS

| | | | | |
|---|---|---|---|---|
| 6,804,632 | B2 * | 10/2004 | Orenstien | G06F 1/206 702/182 |
| 7,043,405 | B2 * | 5/2006 | Orenstien | G06F 1/206 702/184 |
| 8,281,164 | B2 | 10/2012 | Kim | |
| 8,615,647 | B2 * | 12/2013 | Hum | G06F 1/3203 712/32 |
| 2003/0110012 | A1 * | 6/2003 | Orenstien | G06F 1/206 702/188 |
| 2009/0271646 | A1 | 10/2009 | Talwar et al. | |
| 2011/0169562 | A1 * | 7/2011 | Li | H01L 23/50 327/540 |
| 2011/0278938 | A1 * | 11/2011 | McCleer | H02J 7/0065 307/82 |
| 2012/0042176 | A1 * | 2/2012 | Kim | G06F 1/3203 713/300 |
| 2012/0324250 | A1 | 12/2012 | Chakraborty et al. | |
| 2013/0049471 | A1 * | 2/2013 | Oleynik | H02J 3/01 307/65 |
| 2013/0282188 | A1 * | 10/2013 | Donde | G06Q 50/06 700/286 |
| 2014/0096904 | A1 | 4/2014 | Ananthakrishnan et al. | |

OTHER PUBLICATIONS

Muthukaruppan, Thannirmalai Somu, et al. "Hierarchical power management for asymmetric multi-core in dark silicon era." Proceedings of the 50th Annual Design Automation Conference. ACM, 2013.*

* cited by examiner

PORTABLE ELECTRONIC DEVICE AND CORE SWAPPING METHOD THEREOF

BACKGROUND OF THE INVENTION

Field of the Invention

The invention relates to a portable electronic device, and more particularly to a core swapping method for a portable electronic device with multi-cores.

Description of the Related Art

Processing cores have various power consumption profiles based on the architecture, voltage, operating frequency, and performance characteristics thereof. A processing core designed for high performance typically consumes more power than a low performance core that is optimized for power. In a portable electronic device, a plurality of operating cores are configured to perform various applications, such as multimedia tasks, wherein the operating cores having the same performance and power capability are implemented in the same cluster. Traditionally, the same operating cores may operate in a wide frequency range corresponding to a range of power consumption. In general, each operating core is designed for maximum operating frequency, thus power consumption is significant for the portable electronic device.

Therefore, it is necessary to efficiently control power of multi-cores in a portable electronic device.

BRIEF SUMMARY OF THE INVENTION

A portable electronic device and a core swapping method thereof are provided. An embodiment of a portable electronic device is provided. The portable electronic device comprises a power management unit, a multi-core cluster comprising a first processing core and a second processing core, a third processing core, a first switch coupled between the power management unit and the third processing core, and a second switch coupled between the power management unit and the second processing core. The power management unit is configured to provide a first voltage and a second voltage. The first processing core is configured to be powered by the first voltage and operate at a first operating frequency. The second processing core is configured to be powered by the first voltage or the second voltage and operate at a second operating frequency. The third processing core is configured to be powered by the second voltage and operate at a third operating frequency. The first switch is configured to selectively provide the second voltage to the third processing core or stop providing the second voltage to the third processing core according to a first control signal. The second switch is configured to selectively provide the first voltage or the second voltage to the second processing core according to a second control signal.

Furthermore, an embodiment of a core swapping method of a portable electronic device is provided. The portable electronic device comprises a multi-core cluster, which includes a first processing core operating at a first frequency and a second processing core operating at a second frequency, a third processing core operating at a third operating frequency, a power management unit, a first switch and a second switch, wherein a power consumption of the first processing core is larger than a power consumption of the second processing core, and the power consumption of the second processing core is larger than a power consumption of the third processing core. A first voltage and a second voltage are provided by the power management unit. It is determined whether the third processing core is enabled or disabled. When it is determined that the third processing core is enabled, the second switch is switched to receive the first voltage, and the second switch provides the first voltage to power the second processing core, and the first switch is switched to receive the second voltage, and the first switch provides the second voltage to power the third processing core. When it is determined that the third processing core is disabled, the second switch is switched to receive the second voltage, and the second switch provides the second voltage to power the second processing core, and the first switch is switched to stop providing the second voltage to the third processing.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
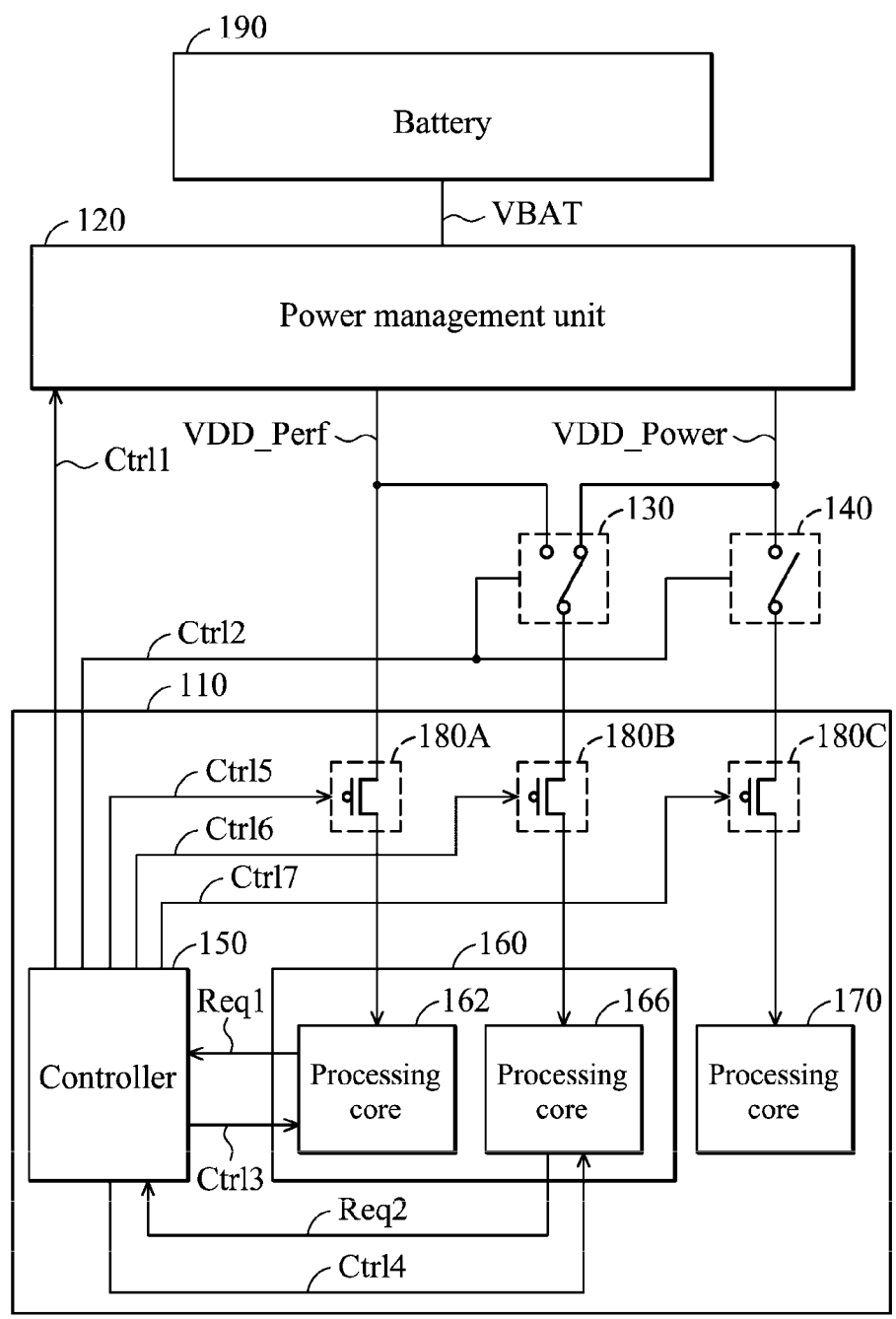
FIG. 1 shows a portable electronic device according to an embodiment of the invention.

FIG. 1 shows a portable electronic device 100 according to an embodiment of the invention. The portable electronic device 100 comprises a central processing unit (CPU) 110, a power management unit 120, the switches 130 and 140 and a battery 190. In the embodiment, the power management unit 120 is a power management integrated circuit (PMIC), wherein the power management unit 120 provides operating voltages VDD_Perf and VDD-Power to power the multi-cores of the CPU 110 according to a control signal Ctrl1 from the CPU 110 and a battery voltage VBAT from the battery 190. The CPU 110 is configured to perform various applications for the portable electronic device 100, and the CPU 110 includes a controller 150, a multi-core cluster 160, a processing core 170 and the power switching units 180A-180C, which are integrated inside the CPU 110. In the embodiment, the multi-core cluster 160 functions as a big core which performs complex applications/tasks of the portable electronic device 100, and the processing core 170 functions as a little core which performs simple applications/tasks of the portable electronic device 100. The multi-core cluster 160 comprises two different types of processing cores 162 and 166, wherein the processing core 162 is a performance core and the processing core 166 is a power core. Furthermore, the processing cores 162, 166 and 170 are designed for various performances. In the embodiment, the processing core 162 is a performance core designed for performance optimization and the processing core 166 is a power core designed for power optimization. Specifically, the processing core 162 consumes more power than the processing core 166. Moreover, the processing core 162 is powered by an output voltage outputted by the power management unit 120 and received from the switching unit 180A, the processing core 166 is powered by an output voltage outputted by the power management unit 120 and received from the switching unit 180B, and the processing core 170 is powered by an output voltage outputted by the power management unit 120 and received from the switching unit 180C.

In the embodiment, the processing core 162 operates at an operating frequency F1 (not shown), the processing core 166 operates at an operating frequency F2 (not shown), and the processing core 170 operates at an operating frequency F3 (not shown). When the processing core 162, the processing core 166 and the processing core 170 operate at the same operating frequency, that is, when the operating frequency F1, the operating frequency F2 and the operating frequency F3 are the same, the power consumption of the processing core 162 is larger than that of the processing core 166, and the power consumption of the processing core 166 is larger than that of the processing core 170.

The switching unit 180A is coupled between the power management unit 120 and the processing core 162, and is configured to provide the operating voltage VDD_Perf received from the power management unit 120 to the processing core 162 according to a control signal Ctrl5 from the controller 150, so as to power the processing core 162. For example, when the switching unit 180A is turned on by the control signal Ctrl5, the switching unit 180A provides the operating voltage VDD_Perf to the processing core 162. Conversely, when the switching unit 180A is turned off by the control signal Ctrl5, the switching unit 180A stops providing the operating voltage VDD_Perf to the processing core 162, that is, the operating voltage VDD_Perf is gated by the switching unit 180A. The switch 130 is coupled between the power management unit 120 and the switching unit 180B, wherein the switch 130 is selectively switched to receive the operating voltage VDD_Perf or the operating voltage VDD_Power and provide the operating voltage VDD_Perf or the operating voltage VDD_Power to the switching unit 180B according to a control signal Ctrl2 from the controller 150. The switching unit 180B is coupled between the switch 130 and the processing core 166 and configured to provide one of the operating voltage VDD_Perf and the operating voltage VDD_Power, which is received from the power management unit 120 through the switch 130, to the processing core 166 according to a control signal Ctrl6 from the controller 150, so as to power the processing core 166. The switch 140 is coupled between the power management unit 120 and the switching unit 180C, wherein the switch 140 is selectively switched on to provide the operating voltage VDD_Power received from the power management unit 120 to the switching unit 180C according to the control signal Ctrl2. For example, when the control signal Ctrl2 is at a first logic level, the switch 140 is switched on and provides the operating voltage VDD_Power to the switching unit 180C. Simultaneously, the switch 130 is switched to receive the operating voltage VDD_Perf and provide the operating voltage VDD_Perf to the switching unit 180B when the control signal Ctrl2 is at the first logic level. Conversely, when the control signal Ctrl2 is at a second logic level different from the first logic level, the switch 140 is switched off and stops providing the operating voltage VDD_Power to the switching unit 180C. Simultaneously, the switch 130 is switched to receive the operating voltage VDD_Power and provide the operating voltage VDD_Power to the switching unit 180B when the control signal Ctrl2 is at the second logic level. The switching unit 180C is coupled between the switch 140 and the processing core 170 and is configured to provide the operating voltage VDD_Power, which is received from the power management unit 120 through the switch 140, to the processing core 170 according to a control signal Ctrl7 from the controller 150, so as to power the processing core 170.

In this embodiment, when the processing core 170 is enabled to perform a task with the operating frequency F3, the switch 140 is switched on and the switching unit 180C is turned on, so that the operating voltage VDD_Power is provided through the switch 140 and the switching unit 180C to power the processing core 170; meanwhile, the switch 130 is switched to receive the operating voltage VDD_Perf and the switching unit 180B is turned on, so that the operating voltage VDD_Perf is provided through the switch 130 and the switching unit 180B to power the processing core 166. Conversely, when the processing core 170 is disabled without performing any task, the switch 140 is switched off to stop providing the operating voltage VDD_Power to the processing core 170, and the switch 130 is switched to receive the operating voltage VDD_Power and the switching unit 180B is turned on, so that the operating voltage VDD_Power is provided through the switch 130 and the switching unit 180B to power the processing core 166; meanwhile, the switching unit 180A is turned on so that the operating voltage VDD_Perf is provided through the switching unit 180A to power the processing core 162.

In FIG. 1, the processing core 162 and the processing core 166 are respectively powered by the operating voltage VDD_Perf and the operating voltage VDD_Power when the processing core 170 is disabled. In response to a requirement Req1 from the processing core 162, the controller 150 may provide a control signal Ctrl3 to control the operating frequency F1 of the processing core 162 or provide the control signal Ctrl1 to adjust the operating voltage VDD_Perf. Furthermore, in response to a requirement Req2 from the processing core 166, the controller 150 may provide a control signal Ctrl4 to control the operating frequency F2 of the processing core 166 or provide the control signal Ctrl1 to adjust the operating voltage VDD_Power. Thus, the performances and the power capabilities of the processing core 162 and the processing core 166 can be optimized for the portable electronic device 100. In one embodiment, the switches 130 and 140 are implemented in the power management unit 120.

Figure 2:
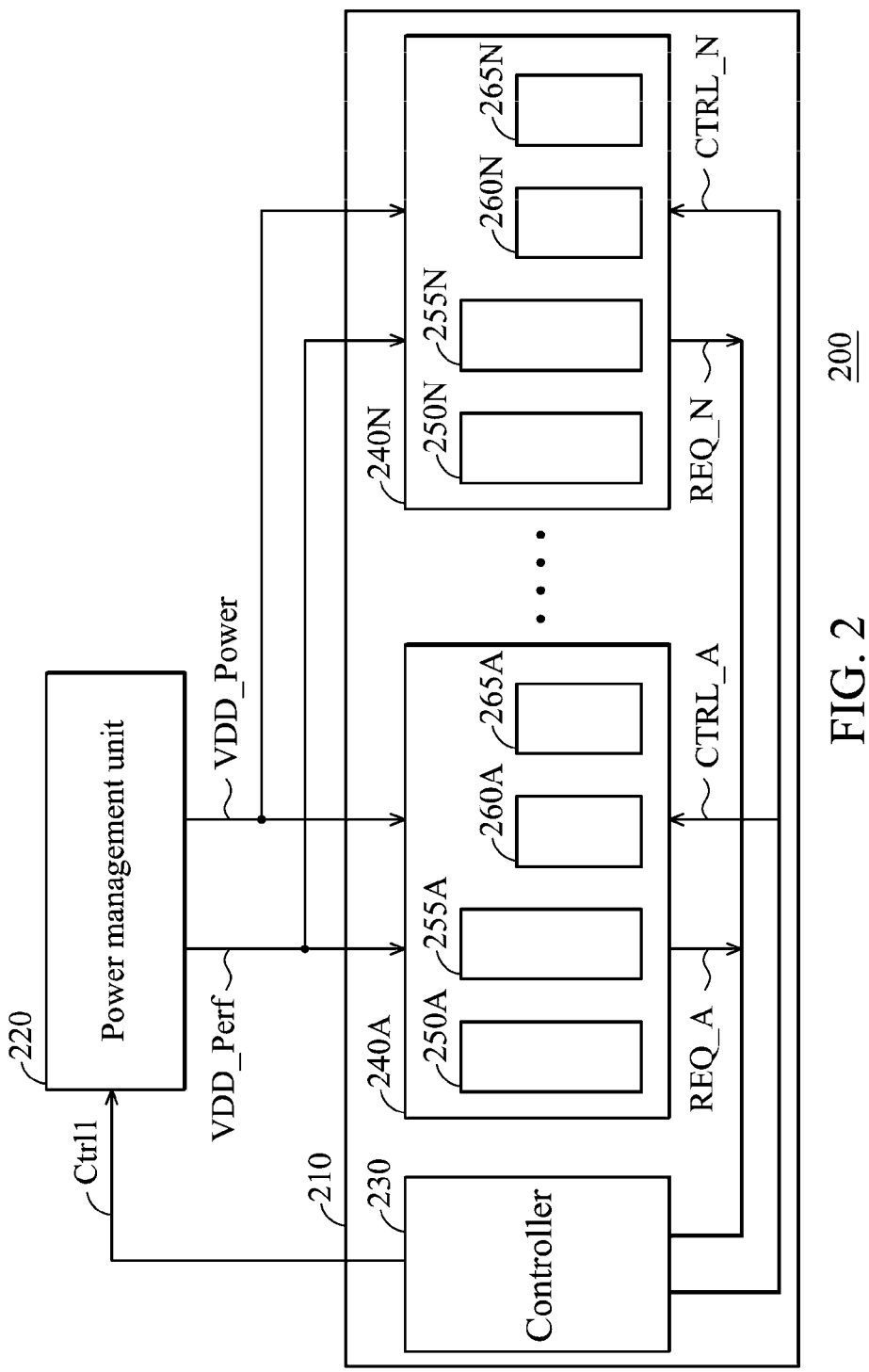
FIG. 2 shows a portable electronic device according to another embodiment of the invention

FIG. 2 shows a portable electronic device 200 according to another embodiment of the invention. The portable electronic device 200 comprises a CPU 210 and a power management unit 220. The CPU 210 includes a controller 230 and a plurality of multi-core clusters 240A-240N, wherein a quantity of the multi-core clusters is determined according to various applications. It should be noted that a little core (e.g. the processing core 170 of FIG. 1) and the corresponding switches (e.g. the switches 130 and 140 of FIG. 1) are omitted in the CPU 210 when the little core is disabled, so as to simplify the description. Each of the multi-core clusters 240A-240N comprises a plurality of performance cores designed for performance optimization and a plurality of power cores designed for power optimization, wherein the performance core consumes more power than the power core. In this embodiment, the multi-core cluster 240A comprises processing cores 250A, 255A, 260A and 265A, wherein the processing cores 250A and 255A are performance cores operating at an operating frequency F1, and the processing cores 260A and 265A are power cores operating at an operating frequency F2. Similarly, the multi-core cluster 240N comprises processing cores 250N, 255N, 260N and 265N, wherein the processing cores 250N and 255N are performance cores operating at an operating frequency F1, and the processing cores 260N and 265N are power cores operating at an operating frequency F2. In addition, the quantities of the performance cores and the power cores are determined according to various applications. As described above, when the little core is disabled in the portable electronic device 200, the performance cores e.g. the processing cores 250A, 255A, 250N and 255N, and the power cores, e.g. the processing cores 260A, 265A, 260N and 265N, in each of the multi-core clusters 240A-240N are respectively powered by the operating voltage VDD_Perf and the operating voltage VDD_Power provided by the power management unit 220.

Similarly, in response to a requirement from one of the multi-core clusters 240A-240N, the controller 230 may provide a control signal to the one of the multi-core clusters 240A-240N, so as to control the operating frequencies of the processing cores thereof. For example, the controller 230 may provide a control signal CTRL_A to control the operating frequency of the processing core 260A in response to a requirement REQ_A from the processing core 260A of the multi-core clusters 240A. Furthermore, when receiving the requirement from the one of the multi-core clusters 240A-240N, the controller 230 may determine whether to provide the control signal Ctrl1, so as to adjust the operating voltages VDD_Perf and the VDD_Power. Thus, the performance and the power capabilities of the multi-core clusters 240A-240N can be optimized for the portable electronic device 200.

Figure 3:
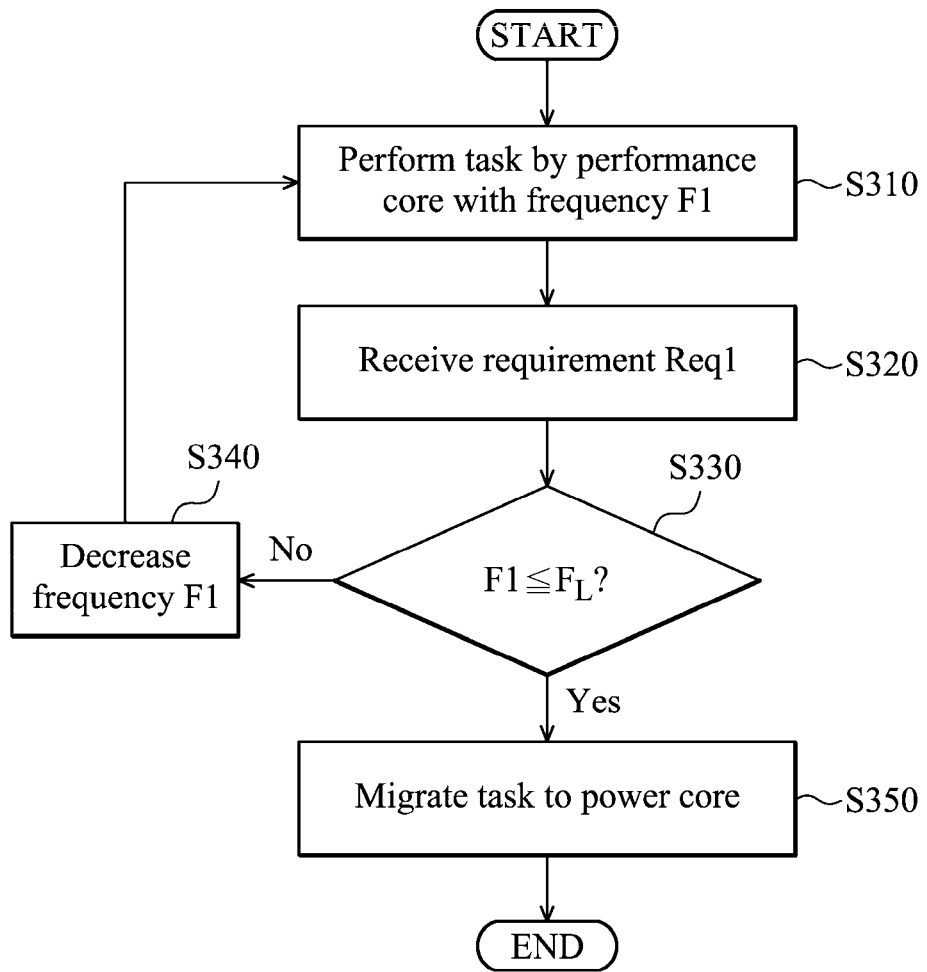
FIG. 3 shows a core swapping method of a portable electronic device with multi-cores according to an embodiment of the invention.

FIG. 3 shows a core swapping method of a portable electronic device with multi-cores according to an embodiment of the invention. Referring to FIG. 1 and FIG. 3 together, in the embodiment, the processing core 170 is disabled, and the processing core 162 is powered by the operating voltage VDD_Perf received from the power management unit 120 through the switching unit 180A and the processing core 166 is powered by the operating voltage VDD_Power received from the power management unit 120 through the switch 130 and the switching unit 180B. First, in step S310, the processing core 166 stays in a sleep mode while the processing core 162 performs a first task with the operating frequency F1. Next, in step S320, the controller 150 receives the requirement Req1 from the processing core 162 or from a frequency generating unit (not shown), wherein the requirement Req1 comprises information associated with the operating frequency F1. Next, in step S330, the controller 150 determines whether the operating frequency F1 is smaller than or equal to a frequency value $F_L$ in response to the requirement Req1, wherein the frequency value $F_L$ is determined according to various applications. If the operating frequency F1 is not smaller than the frequency value $F_L$, the controller 150 provides the control signal Ctrl3 to the processing core 162 or a frequency generating unit (not shown), so as to decrease the operating frequency F1 provided to the processing core 162 (step S340). Furthermore, the controller 150 may provide the control signal Ctrl1 to the power management unit 120, so as to decrease the operating voltage VDD_Perf provided to the processing core 162. When the operating voltage VDD_Perf and/or the operating frequency F1 is decreased, the processing core 162 returns to step S310, to perform the first task with the decreased operating frequency F1. On the contrary, if the operating frequency F1 is smaller than or equal to the frequency value $F_L$, the controller 150 provides the control signal Ctrl4 to wake up the processing core 166 from the sleep mode, so as to perform the first task with the processing core 166, i.e. the power core, operating at the operating frequency F2 (step S350), wherein the operating frequency F2 is smaller than the operating frequency F1. Thus, a task migration is performed from the processing core 162 to the processing core 166 for the first task. Furthermore, the controller 150 may provide the control signal Ctrl3 to control the processing core 162 to enter a sleep mode, thereby power consumption is decreased for the portable electronic device 100. In one embodiment, the controller 150 may further disable the processing core 162 and provide the control signal Ctrl5 to gate the operating voltage VDD_Perf provided to the processing core 162.

Figure 4:
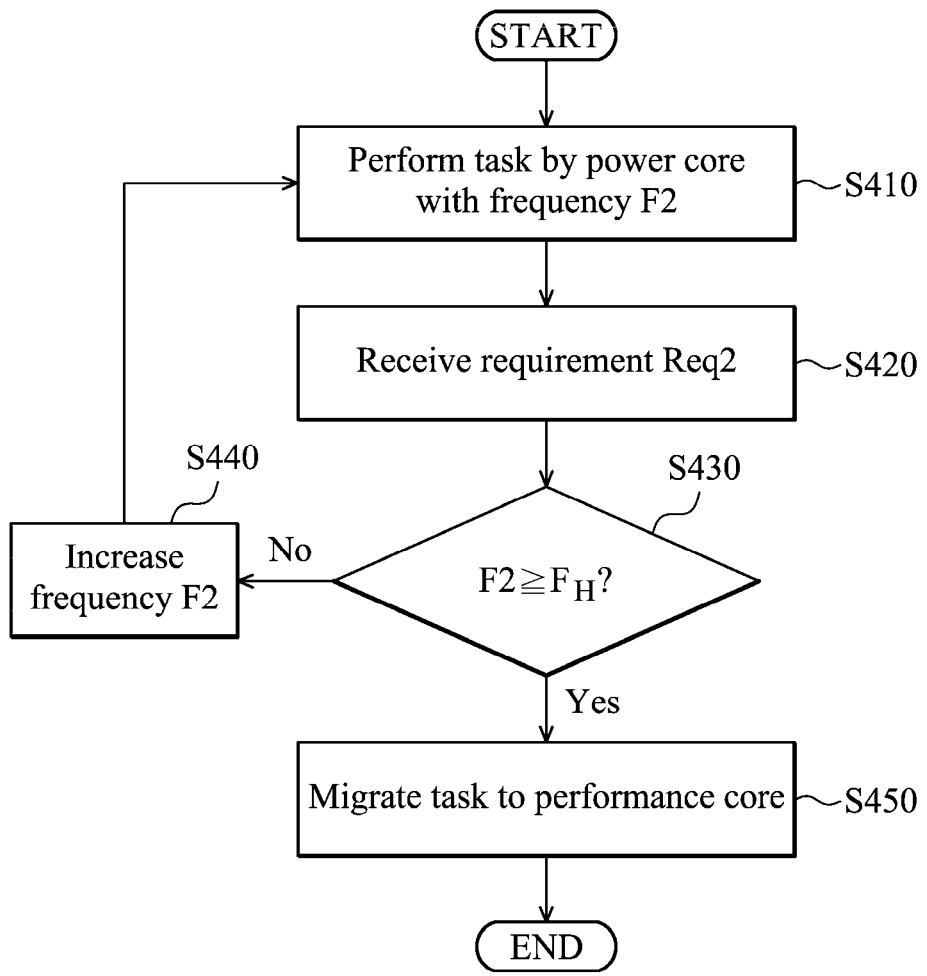
FIG. 4 shows a core swapping method of a portable electronic device with multi-cores according to another embodiment of the invention.

FIG. 4 shows a core swapping method of a portable electronic device with multi-cores according to another embodiment of the invention. Referring to FIG. 1 and FIG. 4 together, in the embodiment, the processing core 170 is disabled, and the processing core 162 is powered by the operating voltage VDD_Perf received from the power management unit 120 through the switching unit 180A, and the processing core 166 is powered by the operating voltage VDD_Power received from the power management unit 120 through the switch 130 and the switching unit 180B. First, in step S410, the processing core 162 stays in a sleep mode while the processing core 166 performs a second task with the operating frequency F2. As described above, the second task may be the first task of step S350 of FIG. 3. Next, in step S420, the controller 150 receives the requirement Req2 from the processing core 166 or from a frequency generating unit (not shown), wherein the requirement Req2 comprises information associated with the operating frequency F2. Next, in step S430, the controller 150 determines whether the operating frequency F2 is larger than or equal to a frequency value $F_H$ in response to the requirement Req2, wherein the frequency value $F_H$ is determined according to various applications. If the operating frequency F2 is not larger than the frequency value $F_H$, the controller 150 provides the control signal Ctrl4 to the processing core 166 or a frequency generating unit (not shown), so as to increase the operating frequency F2 provided to the processing core 166 (step S440). Furthermore, the controller 150 may provide the control signal Ctrl1 to the power management unit 120, so as to increase the operating voltage VDD_Power provided to the processing core 166. When the operating voltage VDD_Power and/or the operating frequency F2 is increased, the processing core 166 returns back to step S410, to perform the second task with the increased operating frequency F2. On the contrary, if the operating frequency F2 is larger than or equal to the frequency value $F_H$, the controller 150 provides the control signal Ctrl3 to wake up the processing core 162 from the sleep mode, so as to perform the second task with the processing core 162, i.e. the performance core, operating at the operating frequency F1 (step S450), wherein the operating frequency F2 is smaller than the operating frequency F1. Thus, a task migration is performed from the processing core 166 to the processing core 162 for the second task. Thus, performance is increased for the CPU of the portable electronic device. In one embodiment, the controller 150 may further disable the processing core 166 and provide the control signal Ctrl6 to gate the operating voltage VDD_Power provided to the processing core 166, so as to decrease the power consumption of the portable electronic device.

Figure 5:
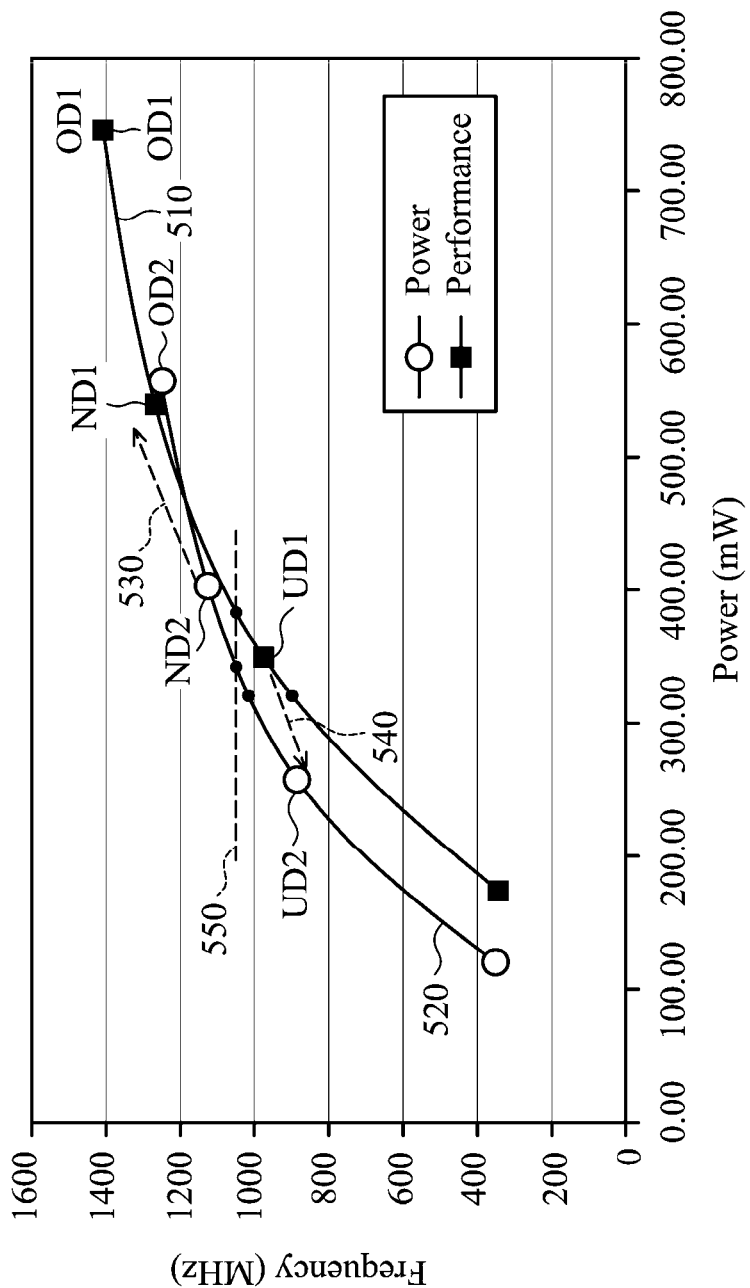
FIG. 5 shows an example diagram for illustrating the core swapping methods of FIG. 3 and FIG. 4.

FIG. 5 shows an example diagram for illustrating the core swapping methods of FIG. 3 and FIG. 4. In FIG. 5, the curve 510 represents the power consumption of the processing core 162, i.e. the performance core, of FIG. 1 in relation to the operating frequency F1, and the curve 520 represents the power consumption of the processing core 166, i.e. the power core, of FIG. 1 in relation to the operating frequency F2, wherein the curve 510 and the curve 520 are different. According to the relationship of the curve 510 and the curve 520, it can be noted that when the processing cores 162 and 166 operates at the same frequency smaller than 1200 MHz, the power consumption of the processing core 162 is larger than that of the processing core 166, as shown in label 550. In addition, when the processing cores 162 and 166 operate at the same frequency larger than 1200 MHz, the power consumption of the processing core 162 is smaller than that of the processing core 166. Referring to FIG. 1, FIG. 4 and FIG. 5, it is assumed that a specific task is performed firstly by the processing core 166 with the operating frequency F2 smaller than 1200 MHz while the processing core 162 stays in a sleep mode in the portable electronic device 100. When it is determined that a workload of the specific task is increased, the processing core 166 provides the requirement Req2 to the controller 150 (e.g. step S420 of FIG. 4), wherein the requirement Req2 comprises information regarding the operating frequency F2. When the controller 150 determines that the operating frequency F2 is not larger than a normal driving frequency value ND2 (i.e. ND2=$F_H$), the controller 150 provides the control signal Ctrl4 to the processing core 166, so as to increase the operating frequency F2 provided to the processing core 166 (e.g. step S440 of FIG. 4). As described above, the controller 150 may provide the control signal Ctrl1 to the power management unit 120, so as to increase the operating voltage VDD_Power provided to the processing core 166. If the operating frequency F2 is larger than or equal to the normal driving frequency value ND2, the processing core 162 is woken up from the sleep mode by the controller 150 (e.g. step S450 of FIG. 4). Thus, the specific task is migrated to the processing core 162 from the processing core 166 and then performed by the processing core 162 with the operating frequency F1 larger than 1200 MHz, e.g. a normal driving frequency value ND1, as shown in an arrowhead 530. It should be noted that the normal driving frequency value ND1 is larger than the normal driving frequency value ND2 (i.e. ND1>ND2). Afterwards, the processing core 162 provides the requirement Req1 to the controller 150, so as to increase or decrease the operating frequency F1 according to the workload of the specific task. When it is determined that a workload of the specific task is decreased and the operating frequency F1 is smaller than or equal to an under driving frequency value UD1, the specific task is migrated back to the processing core 166 from the processing core 162 (e.g. step S350 of FIG. 3). Thus, a task migration is performed, as shown in an arrowhead 540, and the specific task is then performed by the processing core 166 with the operating frequency F2, e.g. an under driving frequency value UD2, as shown in the arrowhead 540. It should be noted that the under driving frequency value UD1 is larger than the under driving frequency value UD2 (i.e. UD1>UD2). In FIG. 5, the operating voltage VDD_Power provided to the processing core 166 and the operating voltage VDD_Perf provided to the processing core 162 can also be suitably adjusted by the controller 150. Specifically, the arrowhead 530 represents that the specific task has migrated from the processing core 166 to the processing core 162 for performance optimization, and the arrowhead 540 represents that the specific task is migrated from the processing core 162 to the processing core 166 for power optimization. Thus, the processing core 166 and the processing core 162 implemented in the same multi-core cluster 160 can be used with high performance and power optimization.

Figure 6:
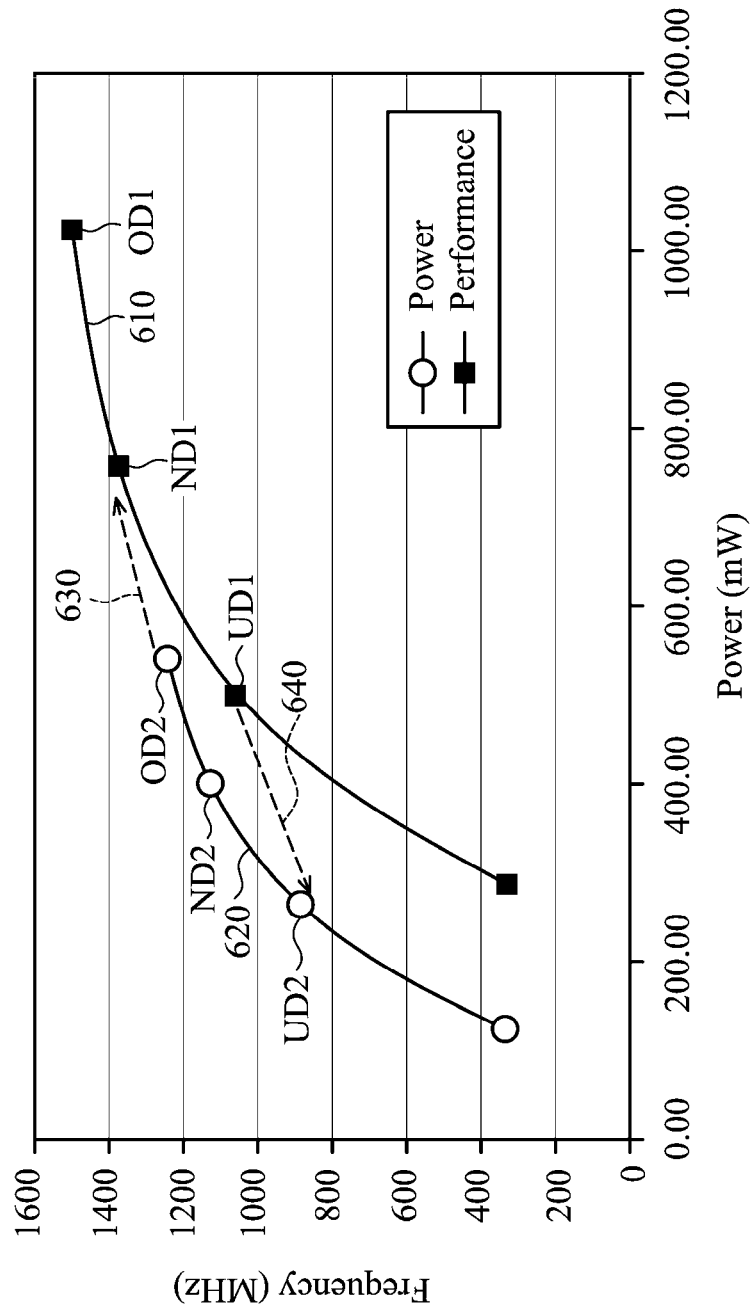
FIG. 6 shows another example diagram for illustrating the core swapping methods of FIG. 3 and FIG. 4.

FIG. 6 shows another example diagram for illustrating the core swapping methods of FIG. 3 and FIG. 4. In FIG. 6, the curve 610 represents the power consumption of the processing core 162, i.e. the performance core, of FIG. 1 in relation to the operating frequency F1, and the curve 620 represents the power consumption of the processing core 166, i.e. the power core, of FIG. 1 in relation to the operating frequency F2, wherein the curve 610 and the curve 620 are different. According to the relationship of the curve 610 and the curve 620, it can be noted that when the processing cores 162 and 166 are operating at the same frequency, the power consumption of the processing core 162 is larger than that of the processing core 166, and when the power consumption of the processing cores 162 and 166 are the same, the operating frequency F1 is smaller than the operating frequency F2. Referring to FIG. 1, FIG. 3 and FIG. 6, it is assumed that a specific task is performed firstly by the processing core 162 with the operating frequency F1 while the processing core 166 stays in a sleep mode in the portable electronic device 100. When it is determined that a workload of the specific task decreased, the processing core 162 provides the requirement Req1 to the controller 150 (e.g. step S320 of FIG. 3), wherein the requirement Req1 comprises information regarding the operating frequency F1. When the controller 150 determines that the operating frequency F1 is not smaller than an under driving frequency value UD1 (i.e. UD1=$F_L$), the controller 150 provides the control signal Ctrl3 to the processing core 162, so as to decrease the operating frequency F1 provided to the processing core 162 (e.g. step S340 of FIG. 3). As described above, the controller 150 may provide the control signal Ctrl1 to the power management unit 120, so as to decrease the operating voltage VDD_Perf provided to the processing core 162. If the operating frequency F1 is smaller than or equal to the under driving frequency value UD1, the processing core 166 is woken up from the sleep mode by the controller 150 (e.g. step S350 of FIG. 3). Thus, the specific task is migrated to the processing core 166 from the processing core 162 and then performed by the processing core 166 with the operating frequency F2, e.g. an under driving frequency value UD2, as shown in an arrowhead 640. It should be noted that the under driving frequency value UD1 is larger than the under driving frequency value UD2 (i.e. UD1>UD2). Afterwards, the processing core 166 provides the requirement Req2 to the controller 150, so as to increase or decrease the operating frequency F2 according to the workload of the specific task. When it is determined that a workload of the specific task is increased and the operating frequency F2 is larger than or equal to an over driving frequency value OD2, the specific task is migrated back to the processing core 162 from the processing core 166 (e.g. step S450 of FIG. 4). Thus, a task migration is performed, as shown in an arrowhead 630, and the specific task is then performed by the processing core 162 with the operating frequency F1, e.g. a normal driving frequency value ND1, as shown in the arrowhead 630. It should be noted that the normal driving frequency value ND1 is larger than the over driving frequency value OD2 (i.e. ND1>OD2). In FIG. 6, the operating voltage VDD_Power provided to the processing core 166 and the operating voltage VDD_Perf provided to the processing core 162 can also be suitably adjusted by the controller 150. Specifically, the arrowhead 630 represents that the specific task has migrated from the processing core 166 to the processing core 162 for performance optimization, and the arrowhead 640 represents that the specific task is migrated from the processing core 162 to the processing core 166 for power optimization. Thus, the processing core 166 and the processing core 162 implemented in the same multi-core cluster 160 can be used with best performance and power optimization.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A portable electronic device, comprising:
a power management unit configured to simultaneously provide a first voltage and a second voltage;
a multi-core cluster, comprising:
a first processing core configured to be powered by the first voltage and operate at a first operating frequency; and
a second processing core configured to be powered by the first voltage or the second voltage and operate at a second operating frequency;
a third processing core configured to be powered by the second voltage and operate at a third operating frequency;
a first switch coupled between the power management unit and the third processing core for receiving the second voltage and configured to selectively provide the second voltage to the third processing core or stop providing the second voltage to the third processing core according to a first control signal; and
a second switch coupled between the power management unit and the second processing core,
wherein the second switch is selectively switched to receive one of the first voltage and the second voltage according to a second control signal, so as to provide the one of the first voltage and the second voltage to the second processing core.

2. The portable electronic device as claimed in claim 1, wherein when the third processing core is enabled to perform a task, the first switch provides the second voltage to power the third processing core and the second switch provides the first voltage to the second processing core.

3. The portable electronic device as claimed in claim 2, wherein when the third processing core is disabled, the first switch stops providing the second voltage to the third processing core and the second switch provides the second voltage to the second processing core.

4. The portable electronic device as claimed in claim 3, wherein when the third processing core is disabled, the first voltage is provided to the first processing core.

5. The portable electronic device as claimed in claim 1, wherein when the first, second and third processing cores operate at the same operating frequency, a power consumption of the first processing core is larger than a power consumption of the second processing core, and the power consumption of the second processing core is larger than a power consumption of the third processing core.

6. The portable electronic device as claimed in claim 5, further comprising:
a controller coupled to the first switch and the second switch and configured to generate the first control signal and the second control signal.

7. The portable electronic device as claimed in claim 6, wherein when the first processing core is enabled to perform a first task with the first operating frequency and the second processing core stays in a sleep mode, the controller is further configured to determine whether the first operating frequency is smaller than a first frequency value.

8. The portable electronic device as claimed in claim 7, wherein when it is determined that the first operating frequency is not smaller than the first frequency value, the controller generates a third control signal to decrease the first operating frequency, and when it is determined that the first operating frequency is smaller than the first frequency value, the controller wakes up the second processing core from the sleep mode and the first task is migrated to the second processing core from the first processing core, such that the first task is performed by the second processing core with the second operating frequency, wherein the second operating frequency is smaller than the first operating frequency.

9. The portable electronic device as claimed in claim 7, wherein when the first operating frequency is not smaller than the first frequency value, the controller generates a forth control signal to the power management unit to decrease the first voltage.

10. The portable electronic device as claimed in claim 6, wherein when the second processing core is enabled to perform a second task with the second operating frequency and the first processing core stays in a sleep mode, the controller is further configured to determine whether the second operating frequency is larger than a second frequency value.

11. The portable electronic device as claimed in claim 10, wherein when it is determined that the second operating frequency is not larger than the second frequency value, the controller generates a fifth control signal to increase the second operating frequency, and when it is determined that the second operating frequency is larger than the second frequency value, the controller wakes up the first processing core from the sleep mode and the second task is migrated to the first processing core from the second processing core, such that the second task is performed by the first processing core with the first operating frequency, wherein the first operating frequency is larger than the second operating frequency.

12. The portable electronic device as claimed in claim 10, wherein when the second operating frequency is not larger than the second frequency value, the controller generates a sixth control signal to the power management unit to increase the second voltage.

13. The portable electronic device as claimed in claim 6, wherein the multi-core cluster, the third processing core and the controller are integrated inside a CPU.

14. The portable electronic device as claimed in claim 13, further comprising:
a first switching unit integrated inside the CPU and coupled between the power management unit and the first processing core for providing the first voltage to power the first processing core according to a third control signal;
a second switching unit integrated inside the CPU and coupled between the second switch and the second processing core for providing the first or second operating voltage to power the second processing core according to a forth control signal; and a third switching unit integrated inside the CPU and coupled between the power management unit and the third processing core for providing the second operating voltage to power the third processing core according to a fifth control signal, wherein the first switch and the second switch are implemented in the power management unit.

15. A core swapping method of a portable electronic device, wherein the portable electronic device comprises a multi-core cluster, which includes a first processing core operating at a first frequency and a second processing core operating at a second frequency, a third processing core operating at a third operating frequency, a power management unit, a first switch and a second switch coupled to the power management unit, wherein a power consumption of the first processing core is larger than a power consumption of the second processing core, and the power consumption of the second processing core is larger than a power consumption of the third processing core, the method comprising:

simultaneously providing a first voltage and a second voltage by the power management unit;

determining whether the third processing core is enabled or disabled;

when it is determined that the third processing core is enabled, switching the second switch to receive the first voltage so as to provide the first voltage to power the second processing core via the second switch, and switching the first switch to receive the second voltage and providing the second voltage to power the third processing core; and when it is determined that the third processing core is disabled, switching the second switch to receive the second voltage so as to provide the second voltage to power the second processing core via the second switch, and switching the first switch to stop providing the second voltage to the third processing.

16. The core swapping method as claimed in claim 15, wherein when the first processing core is enabled to perform a first task with the first operating frequency and the second processing core stays in a sleep mode, the method further comprises:

determining whether the first operating frequency is smaller than a first frequency value; and when it is determined that the first operating frequency is not smaller than the first frequency value, decreasing the first operating frequency.

17. The core swapping method as claimed in claim 16, further comprising:

when it is determined that the first operating frequency is smaller than the first frequency value, waking up the second processing core from the sleep mode and migrating the first task to the second processing core from the first processing core; and performing the first task by the second processing core with the second operating frequency when the first task is migrated to the second processing core, wherein the second operating frequency is smaller than the first operating frequency.

18. The core swapping method as claimed in claim 16, further comprising:

when it is determined that the first operating frequency is not smaller than the first frequency value, decreasing the first voltage.

19. The core swapping method as claimed in claim 15, wherein when the second processing core is enabled to perform a second task with the second operating frequency and the first processing core stays in a sleep mode, the method further comprises:

determining whether the second operating frequency is larger than a second frequency value; and when it is determined that the second operating frequency is not larger than the second frequency value, increasing the second operating frequency.

20. The core swapping method as claimed in claim 19, further comprising:

when it is determined that the second operating frequency is larger than the second frequency value, waking up the first processing core from the sleep mode and migrating the second task to the first processing core from the second processing core; and performing the second task by the first processing core with the first operating frequency when the second task is migrated to the first processing core, wherein the first operating frequency is larger than the second operating frequency.

21. The core swapping method as claimed in claim 19, further comprising:

when it is determined that the second operating frequency is not larger than the second frequency value, increasing the second voltage.

* * * * *